US011425851B2

(12) United States Patent
Takahashi

(10) Patent No.: US 11,425,851 B2
(45) Date of Patent: Aug. 23, 2022

(54) ELECTRONIC COMPONENT MOUNTING MACHINE AND MOUNTING METHOD

(71) Applicant: FUJI CORPORATION, Chiryu (JP)

(72) Inventor: Akira Takahashi, Okazaki (JP)

(73) Assignee: FUJI CORPORATION, Chiryu (JP)

(*) Notice: Subject to any disclaimer, the term of this patent is extended or adjusted under 35 U.S.C. 154(b) by 224 days.

(21) Appl. No.: 16/497,978

(22) PCT Filed: Mar. 31, 2017

(86) PCT No.: PCT/JP2017/013540
§ 371 (c)(1),
(2) Date: Sep. 26, 2019

(87) PCT Pub. No.: WO2018/179315
PCT Pub. Date: Oct. 4, 2018

(65) Prior Publication Data
US 2020/0253102 A1 Aug. 6, 2020

(51) Int. Cl.
H05K 13/04 (2006.01)
H05K 13/08 (2006.01)
H05K 13/00 (2006.01)

(52) U.S. Cl.
CPC ..... *H05K 13/0469* (2013.01); *H05K 13/0061* (2013.01); *H05K 13/0409* (2018.08); *H05K 13/0812* (2018.08); *H05K 13/0882* (2018.08)

(58) Field of Classification Search
CPC ........... H05K 13/0061; H05K 13/0409; H05K 13/0469; H05K 13/0812; H05K 13/0882
See application file for complete search history.

(56) References Cited

FOREIGN PATENT DOCUMENTS

| JP | 2007-281024 A | 10/2007 |
| JP | 2009-260105 A | 11/2009 |
| JP | 4604127 B2 * | 12/2010 |
| JP | 2013-21436 A | 10/2013 |
| JP | 2015142006 A * | 8/2015 |
| WO | 2015019447 A1 * | 2/2015 |
| WO | 2015097731 A1 * | 7/2015 |

OTHER PUBLICATIONS

International Search Report dated Jun. 20, 2017 in PCT/JP2017/013540 filed on Mar. 31, 2017.

* cited by examiner

*Primary Examiner* — Carl J Arbes
(74) *Attorney, Agent, or Firm* — Oblon, McClelland, Maier & Neustadt, L.L.P.

(57) ABSTRACT

An electronic component mounting machine includes a storage section configured to store viscous fluid, a head section configured to hold an electronic component having a bump and to immerse the bump of the electronic component in the viscous fluid, an irradiation section configured to irradiate the bump, to which the viscous fluid has been transferred, with light, an imaging section configured to capture an image of the bump irradiated with light from the irradiation section, and a control device. The control device executes detection processing for detecting a transfer amount of the viscous fluid transferred to the bump based on image data captured by the imaging section, determination processing for determining whether the transfer amount is good or bad, and transfer processing for transferring the viscous fluid to the bump in accordance with the transfer amount being less than a predetermined threshold.

4 Claims, 9 Drawing Sheets

|  |  | First flux unit | | Second flux unit | |
|---|---|---|---|---|---|
| Bump height | | 300 | 250 | 100 | 80 |
| Allowable film thickness range | Upper limit value 60% | 180 | 150 | 60 | 48 |
|  | Lower limit value 60% | 90 | 75 | 30 | 24 |
| Common film thickness value CT | | 100 $\mu$m | | 40 $\mu$m | |

ELECTRONIC COMPONENT MOUNTING MACHINE AND MOUNTING METHOD

TECHNICAL FIELD

The present application relates to an electronic component mounting machine for transferring viscous fluid to a bump of an electronic component and a mounting method thereof.

BACKGROUND ART

Conventionally, some electronic component mounting machines include a transfer device for transferring viscous fluid (e.g. solder or flux) to a bump of electronic components to be mounted, for example, a bump of electronic components of BGAs (Ball Grid Array) (for example, patent literature 1). In such an electronic component mounting machine, before an electronic component held by a suction nozzle of a mounting head is soldered to a board, a bump of the electronic component is immersed in viscous fluid stored in a storage section of a transfer device so that the viscous fluid is transferred to the bump.

In this electronic component mounting machine, after the transfer, a surface of the electronic component on which the bump is provided is irradiated with light to capture an image of the bump using an imaging section. The electronic component mounting machine calculates the brightness of the bump from the captured image data, and when the calculated brightness is higher than a predetermined threshold, the electronic component mounting machine determines that the transfer is defective.

Patent Literature

Patent Literature 1: JP-A-2007-281024

BRIEF SUMMARY

Technical Problem

In the electronic component mounting machine described above, it is possible to determine whether the transfer is good or bad based on the brightness. However, in this type of electronic component mounting machine, there is room for improvement in the process of transferring the viscous fluid of the transfer device to the bump of the electronic component.

The present disclosure has been made in view of the above problems, and an object thereof is to provide an electronic component mounting machine and a mounting method capable of transferring an appropriate amount of viscous fluid to a bump.

Solution to Problem

The present application discloses an electronic component mounting machine including: a storage section configured to store viscous fluid; a head section configured to hold an electronic component having a bump and to immerse the bump of the electronic component in the viscous fluid; an irradiation section configured to irradiate light to the bump to which the viscous fluid has been transferred; an imaging section configured to capture an image of the bump irradiated with the light by the irradiation section; and a control device, wherein the control device executes: detection processing for detecting a transfer amount of the viscous fluid transferred to the bump based on image data captured by the imaging section; determination processing for determining whether the transfer amount is good or bad, and transfer processing for transferring the viscous fluid to the bump in accordance with the transfer amount being less than a predetermined threshold.

The present application also discloses an electronic component mounting machine including: a conveyance section configured to convey a board; a storage section configured to store viscous fluid; a head section configured to hold an electronic component having a bump; and a control device configured to control the head section, to immerse the bump of the electronic component in the viscous fluid, and to mount the electronic component having the bump to which the viscous fluid has been transferred on the board, in which the control device performs detection processing for detecting an allowable film thickness range allowed as a film thickness of a fluid film formed by the viscous fluid stored in the storage section for each of the multiple electronic components mounted on the board, and determination processing for determining whether a common film thickness value satisfying the allowable film thickness range of at least two electronic components among the multiple electronic components mounted on the board exists.

Further, the present application is not limited to the electronic component mounting machine, and can also be applied to a mounting method executed by the electronic component mounting machine.

Advantageous Effects

With the techniques disclosed in the present application, it is possible to provide an electronic component mounting machine and a mounting method capable of transferring an appropriate amount of viscous fluid to a bump.

DESCRIPTION OF EMBODIMENTS

First Embodiment

Figure 1:
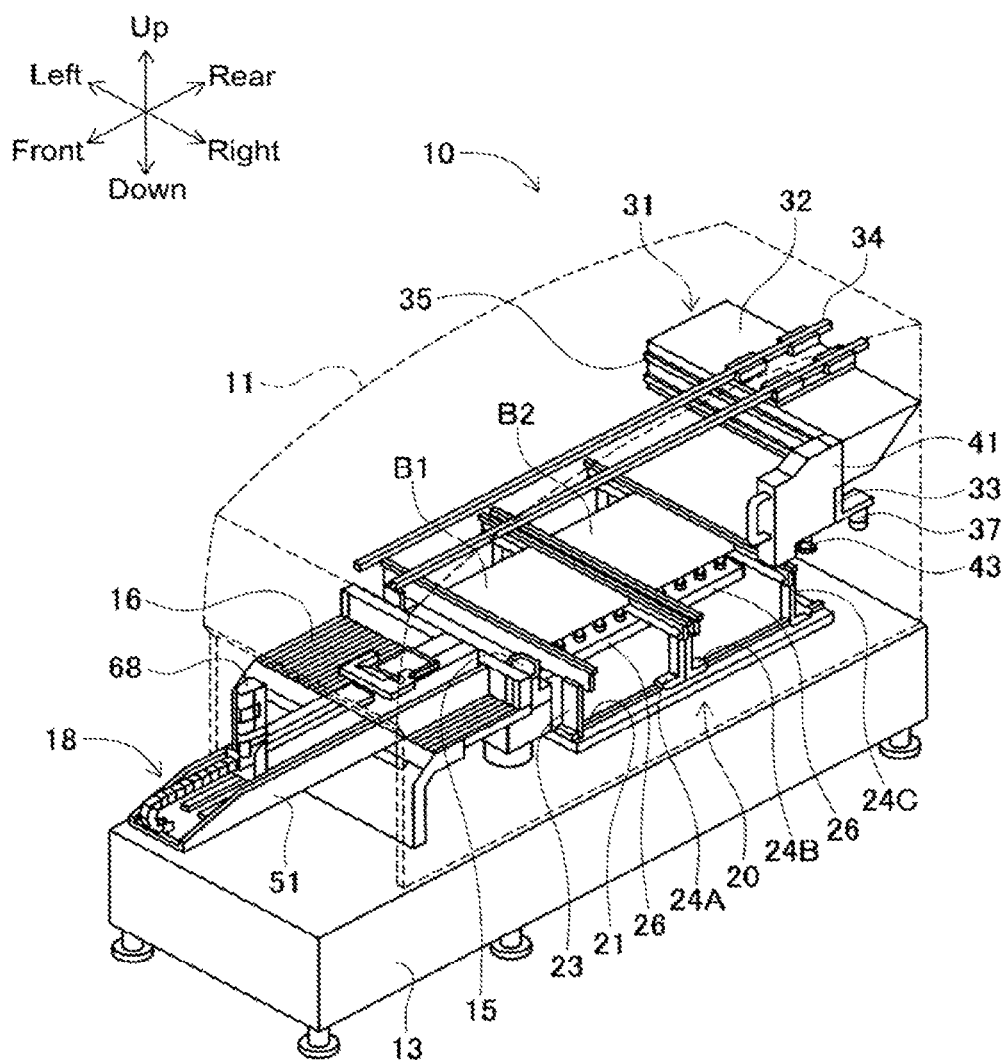
FIG. 1 is a perspective view of an electronic component mounting machine to which a flux unit of a first embodiment is attached.
Figure 2:
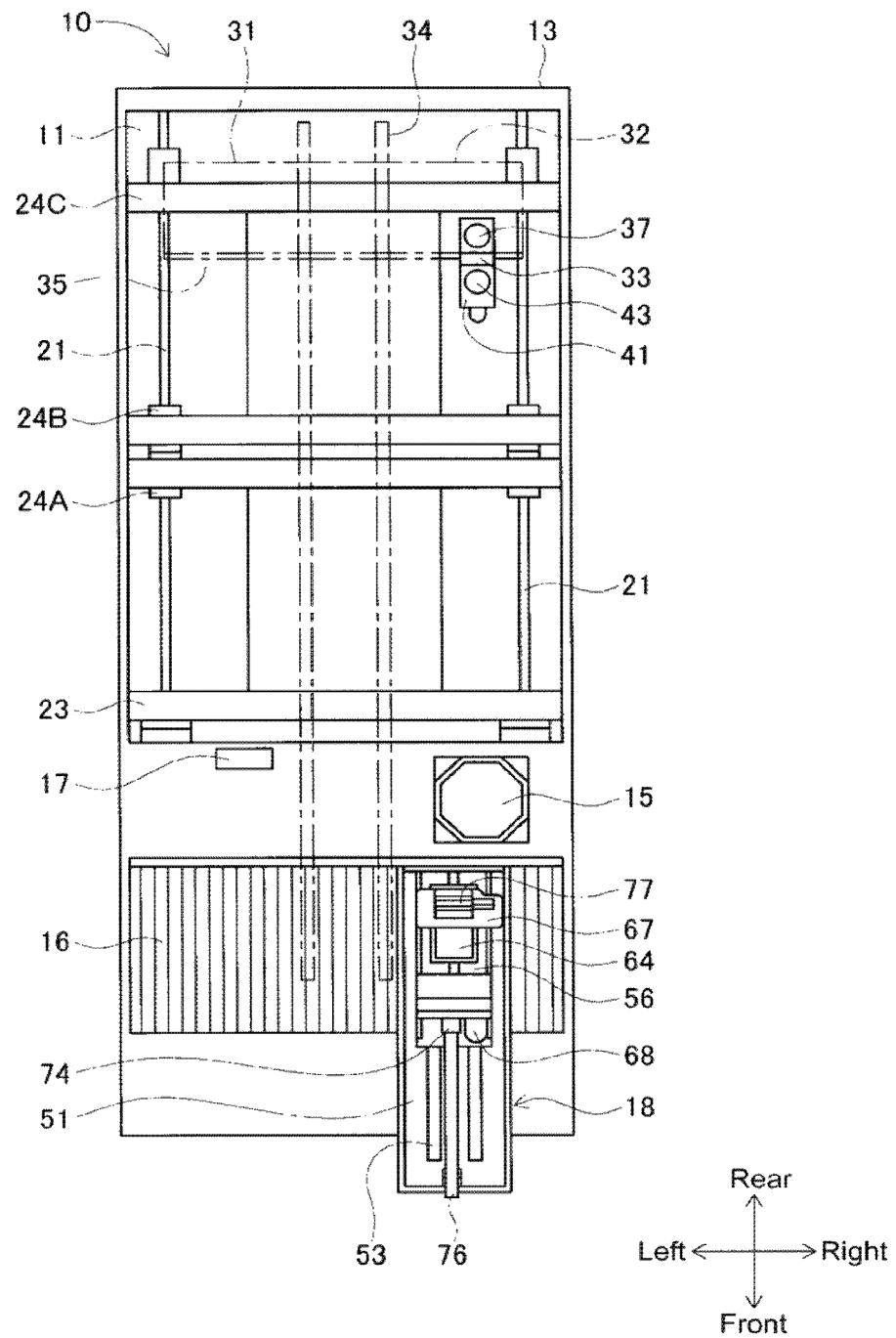
FIG. 2 is a top view of the electronic component mounting machine.

Hereinafter, a first embodiment of the present application will be described with reference to the drawings. FIG. 1 is a perspective view of electronic component mounting machine 10 according to the first embodiment, and shows housing 11 of electronic component mounting machine 10 in a transparent manner. FIG. 2 is a top view of electronic component mounting machine 10. Electronic component mounting machine 10 is a device for mounting electronic components on conveyed boards B1 and B2.

Electronic component mounting machine 10 has various devices covered with housing 11 on base 13 disposed on a floor of a manufacturing factory or the like in which electronic component mounting machine 10 is installed. Base 13 is formed in a substantially rectangular parallelepiped shape. Board conveyance device 20 of electronic component mounting machine 10 is a device for conveying boards B1 and B2, and has a pair of guide rails 21. The pair of guide rails 21 extend along the longitudinal direction of base 13 and are disposed on base 13. In the following description, a direction in which the pair of guide rails 21 are extended is referred to as a front-rear direction, and a direction perpendicular to the front-rear direction and horizontal to the installation surface of the device (a direction in which boards B1 and B2 are conveyed) is referred to as a left-right direction, a direction perpendicular to both the front-rear direction and the left-right direction is referred to as an up-down direction.

Board conveyance device 20 has fixed wall 23 that stands on an upper face of a substantially central portion of base 13. The front ends of the pair of guide rails 21 are connected to both left and right end portions of fixed wall 23. On the rear side of fixed wall 23, three movable walls 24A, 24B, and 24C are arranged in order from the front toward the rear. Each of three movable walls 24A to 24C is attached at both end portions in the left-right direction so as to be slidable in the front-rear direction with respect to guide rail 21.

Between fixed wall 23 and movable wall 24A in the front-rear direction, a lane for conveying board B1 in the left-right direction is formed. Similarly, a lane for conveying board B2 in the left-right direction is formed between movable walls 24B and 24C in the front-rear direction. Movable walls 24A and 24B are disposed adjacent to each other in the front-rear direction in a state in which two lanes for conveying each of boards B1 and B2 are formed. Each of fixed wall 23 and movable wall 24A includes a conveyor belt for conveying board B1 in the left-right direction at the upper portion thereof. Similarly, each of movable walls 24B and 24C has a conveyor belt for conveying board B2 in the left-right direction at the upper portion thereof. Control device 91 (see FIG. 4) of electronic component mounting machine 10 causes board conveyance device 20 to drive the conveyor belt, and conveys boards B1 and B2 from the left to the right on the lane.

Backup table 26 for fixing boards B1 and B2 is provided in two lanes formed by fixed wall 23 and each of three movable walls 24A to 24C. Each of backup tables 26 is provided on base 13 below boards B1 and B2, and is configured to be able to move up and down in the up-down direction. Each of backup tables 26 is provided with multiple backup pins on a rectangular plate-like upper face, and each of boards B1 and B2 is supported by the backup pins from below and held fixedly under the control of control device 91.

XY robot 31 is provided at an upper portion of electronic component mounting machine 10. XY robot 31 includes Y-direction slider 32, X-direction slider 33, a pair of left and right Y-direction guide rails 34, and a pair of upper and lower X-direction guide rails 35. In FIG. 2, Y-direction slider 32, Y-direction guide rails 34, and X-direction guide rails 35 are indicated by one-dot chain lines in order to avoid complication of the drawing. The X-direction corresponds to the left-right direction, and the Y-direction corresponds to the front-rear direction.

Each of the pair of Y-direction guide rails 34 is disposed in a portion close to the upper face in the inner cavity of housing 11, and extends in the front-rear direction. Y-direction slider 32 is attached to Y-direction guide rails 34 so as to be slidable in the front-rear direction. Each of the X-direction guide rails 35 is disposed on the front face of Y-direction slider 32 and extends in the left-right direction. X-direction slider 33 is attached to X-direction guide rails 35 so as to be slidable in the left-right direction. Mark camera 37 for capturing an image of a reference mark, a model number, or the like attached to the surface of boards B1 and B2 is attached to the lower face of X-direction slider 33. Mark camera 37 is fixed to X-direction slider 33 in a state facing downward, and can capture an image at any position on base 13 by XY robot 31.

Mounting head 41 is attached to X-direction slider 33. Mounting head 41 is configured to be movable to any position on base 13 by XY robot 31. Mounting head 41 is configured to be slidable in the up-down direction with respect to X-direction slider 33. Mounting head 41 mounts the electronic components to boards B1 and B2. Mounting head 41 has suction nozzle 43 provided on a lower end face thereof. Suction nozzle 43 picks up and holds the electronic component or removes the held electronic component under the control of control device 91. Further, mounting head 41 changes the position of the electronic component held by suction nozzle 43 in the up-down direction under the control of control device 91.

In addition, electronic component mounting machine 10 includes component camera 15 and discard box 17 at a position on base 13 on the front side of fixed wall 23. Component camera 15 includes an imaging element such as a CCD, and is used to capture an image of an electronic component picked up by suction nozzle 43 of mounting head 41. Component camera 15 includes light section 15A (see FIG. 4). Light section 15A includes a light source such as an LED, for example, and irradiates the lower face of the electronic component picked up and held by mounting head 41 with light. Component camera 15 of the present embodiment is also used for capturing an image of a flux transferred to a bump of an electronic component. Component camera 15 irradiates the lower face of the electronic component with the light of light section 15A, and captures an image of the bumps on the lower face of the electronic component. Discard box 17 is a box for discarding electronic components. For example, the electronic components to which the flux is excessively transferred are discarded into discard box 17 by mounting head 41.

Figure 3:
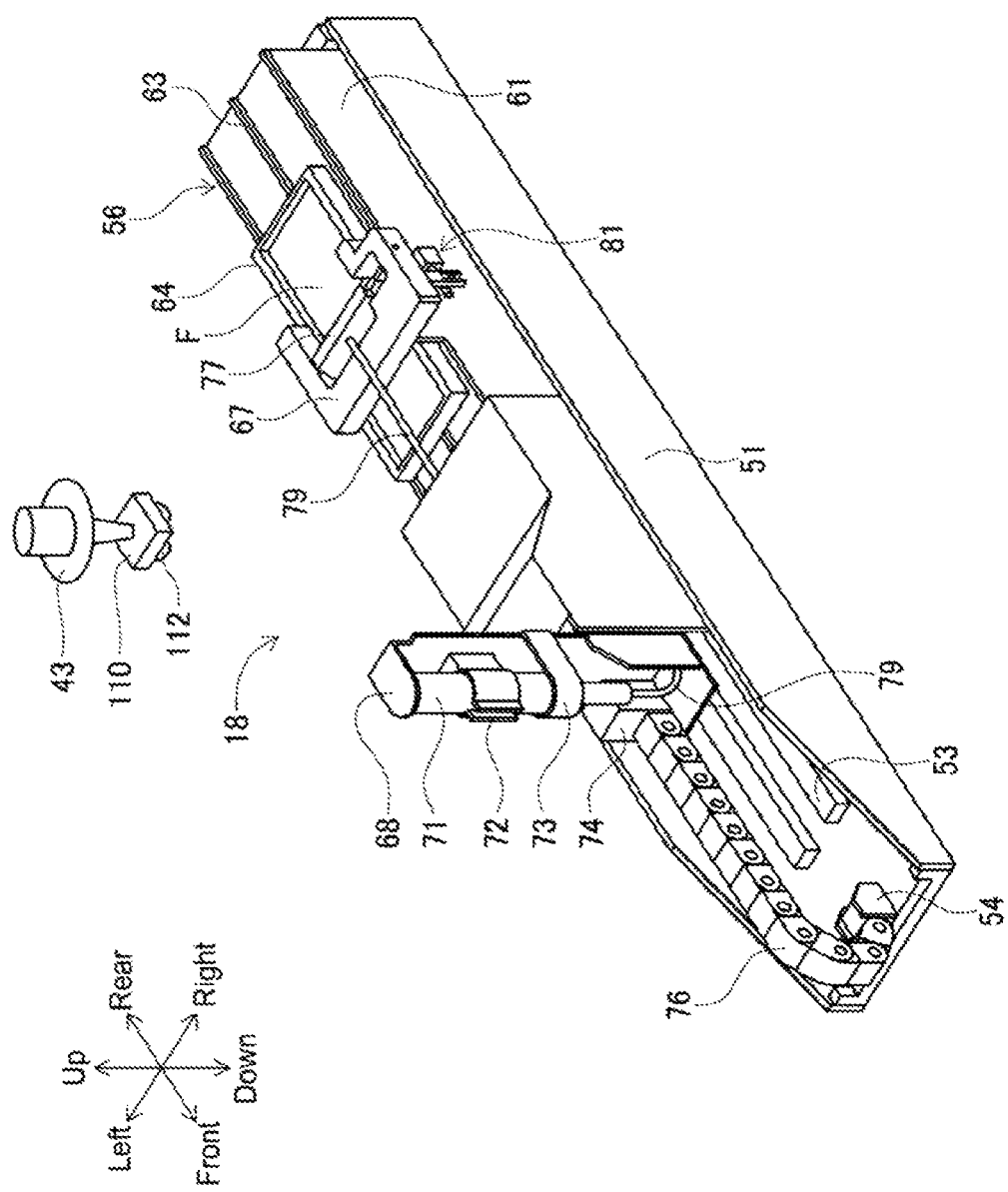
FIG. 3 is a perspective view of the flux unit.

Further, in electronic component mounting machine 10, device table 16 is provided on the upper face on the front side of base 13 so as to be slidable in the front-rear direction. Flux unit 18 is attached to the upper face of device table 16. FIG. 3 is a perspective view of flux unit 18. Base section 51 of flux unit 18 is attached to the upper face of device table 16 (see FIGS. 1 and 2). Base section 51 includes a rectangular bottom plate extending in the front-rear direction and a pair of side plates extending vertically upward from left-right end portions of the bottom plate, and constitutes a U-shaped groove extending in the front-rear direction. A pair of guide rails 53, which are opposed to each other in the left-right direction and extend along the front-rear direction, are disposed on the upper face of the bottom plate in base section 51. Base section 51 is provided with cable connecting section 54 at the front end portion on the bottom plate. Flux unit 18 includes unit main body section 56 which is connected to cable connecting section 54 and which is movable in the front-rear direction along guide rail 53. Unit main body section 56 includes rectangular parallelepiped-shaped seat 61 extending in the front-rear direction. Seat 61 is formed so as to fit in the U-shaped groove of base section 51. Seat 61 is provided with a guided section formed in accordance with the shape of guide rail 53 provided on the bottom plate of base section 51, and unit main body section 56 is configured to be movable in the front-rear direction with respect to guide rail 53 (base section 51) by an actuator (not shown).

Single guide rail 63 extending in the front-rear direction is disposed on the upper face of seat 61. Storage section 64 in which flux F is stored is provided on seat 61. Storage section 64 is provided with a guided section formed in accordance with the shape of guide rail 63, and is configured to be movable in the front-rear direction with respect to guide rail 63 (unit main body section 56) by an actuator (not shown). When viewed from above, storage section 64 has a rectangular shape with its longitudinal direction extending in the front-rear direction, and is formed of a shallow tray. Flux F is stored in storage section 64. Frame 67 is provided at an upper portion of storage section 64. Frame 67 is formed in a substantially U-shaped plate shape in which the rear side is open when viewed from above. Frame 67 is extended from both left and right ends of seat 61 so as to straddle storage section 64 in the left-right direction.

Syringe holding section 68 is provided at a front end portion of unit main body section 56. Cylindrical syringe 71 is fixed to syringe holding section 68 by clip 72 and belt 73. Flux F is stored in syringe 71. Cable connecting section 74 is provided at a lower portion of syringe holding section 68. Cable connecting section 74 is connected to cable connecting section 54 of base section 51 by cable 76. Various power supply lines, signal lines, and the like are accommodated in cable 76.

Frame 67 has squeegee 77 rockably mounted in a U-shaped opening via a rocking shaft (not shown). Squeegee 77 is formed, for example, in a V-shaped plate shape that opens downward when viewed from the left-right direction. On the other hand, liquid pumping tube 79 is attached to the lower face of syringe 71. One end of liquid pumping tube 79 is connected to syringe 71 and the other end is connected to squeegee 77, and the inside of syringe 71 and the inside of the V-shaped opening of squeegee 77 are connected with each other. Flux unit 18 is configured to be able to supply flux F from syringe 71 to storage section 64 via liquid pumping tube 79.

Unit main body section 56 includes actuator 81 for adjusting the height of squeegee 77. Control device 91 drives actuator 81 to adjust the height of squeegee 77. Control device 91 drives actuator 81 to change the angle and position of squeegee 77. As a result, control device 91 can adjust the film thickness of flux F in storage section 64. Control device 91 causes mounting head 41 to adjust the film thickness of the fluid film formed by flux F, so that bump 112 of electronic component 110 picked up by suction nozzle 43 is immersed in flux F.

Figure 4:
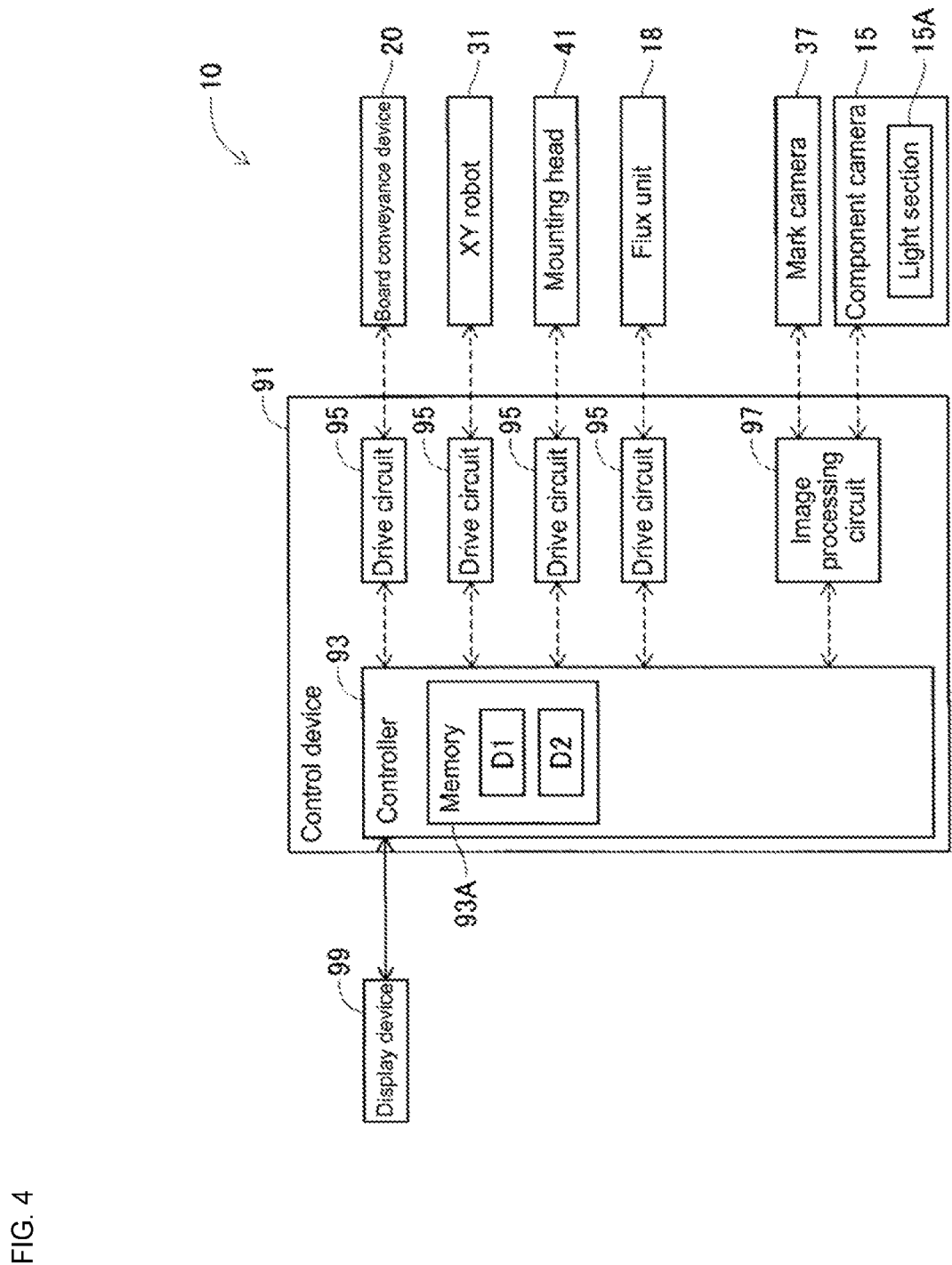
FIG. 4 is a block diagram of the electronic component mounting machine.

As shown in FIG. 4, electronic component mounting machine 10 includes control device 91. Control device 91 includes controller 93, multiple drive circuits 95, and the like. Multiple drive circuits 95 are connected to a driving source (such as an electromagnetic motor) of board conveyance device 20. Controller 93 includes a CPU, a ROM, a RAM, and the like, and mainly includes a computer, and is connected to multiple drive circuits 95. As a result, board conveyance device 20 and the like are controlled by controller 93. Controller 93 inputs image data of mark camera 37 and component camera 15 via image processing circuit 97. Control device 91 can control light section 15A of component camera 15 via image processing circuit 97.

Electronic component mounting machine 10 includes display device 99. Display device 99 is, for example, a touch panel, and includes a liquid crystal panel, a light source such as an LED for irradiating light from the rear surface side of the liquid crystal panel, a touch sensing film bonded to the surface of the liquid crystal panel, and the like. Display device 99 displays various types of information and accepts an operation from a user under the control of control device 91.

Mounting Work by Component Mounter 10

Electronic component mounting machine 10 of the present embodiment receives control data D1 from, for example, a management device (not shown) connected via a network, and stores received control data D1 in memory 93A of controller 93. Based on control data D1, controller 93 performs mounting work on boards B1 and B2 held by board conveyance device 20 by mounting head 41. Specifically, controller 93 causes board conveyance device 20 to convey boards B1 and B2 to the work position and securely hold them. Controller 93 supplies electronic component 110 from a supply device (not shown). The supply device is, for example, a tape feeder, and is mounted on device table 16. Mounting head 41 picks up and holds electronic component 110 supplied from the supply device by suction nozzle 43 under the control of controller 93.

Subsequently, mounting head 41 moves to the upper side of component camera 15 under the control of controller 93, and an image of the picked up electronic component 110 is captured. Controller 93 acquires an error of the suction position based on the captured image data. Next, mounting head 41 moves to the upper side of flux unit 18 under the control of controller 93 to lower electronic component 110. As a result, flux F is transferred to bump 112 of electronic component 110. Mounting head 41 moves to the upper side of any of boards B1 and B2 fixed to the work position under the control of controller 93 to correct suction position errors and the like and mount held electronic components 110 at a predetermined position on boards B1 and B2.

Film Thickness Adjusting Work by Component Mounter 10 Electronic component mounting machine 10 of the present embodiment automatically adjusts the film thickness of flux F in storage section 64. For example, electronic component mounting machine 10 performs a work of adjusting the film thickness of flux F prior to the mounting work described above. Electronic component mounting machine 10 may perform the following film thickness adjustment in the middle of performing the mounting work described above.

Figure 5:
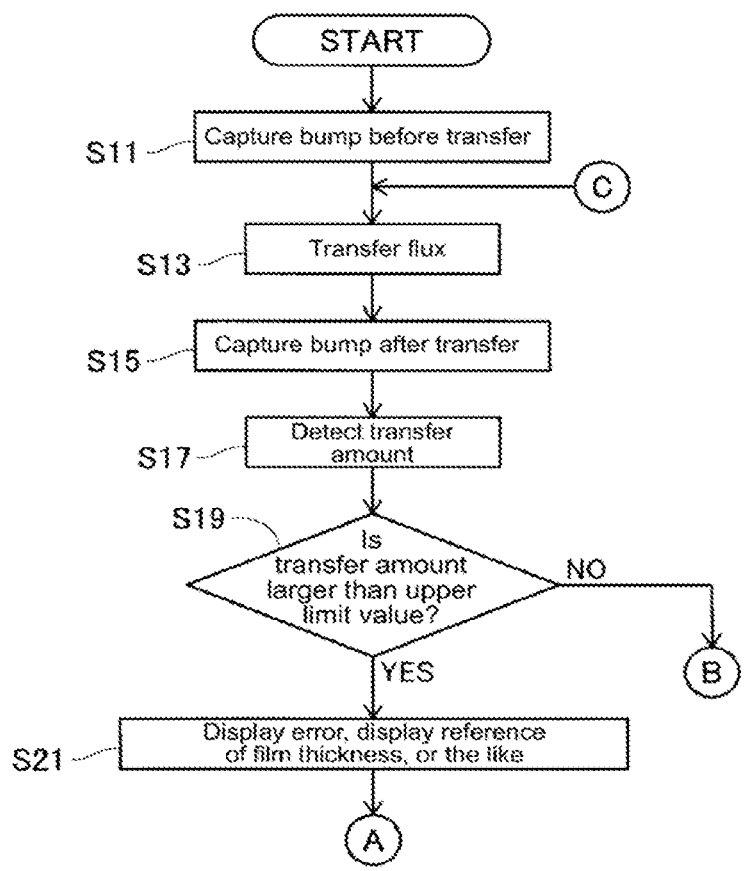
FIG. 5 is a flowchart of a film thickness adjusting work.
Figure 6:
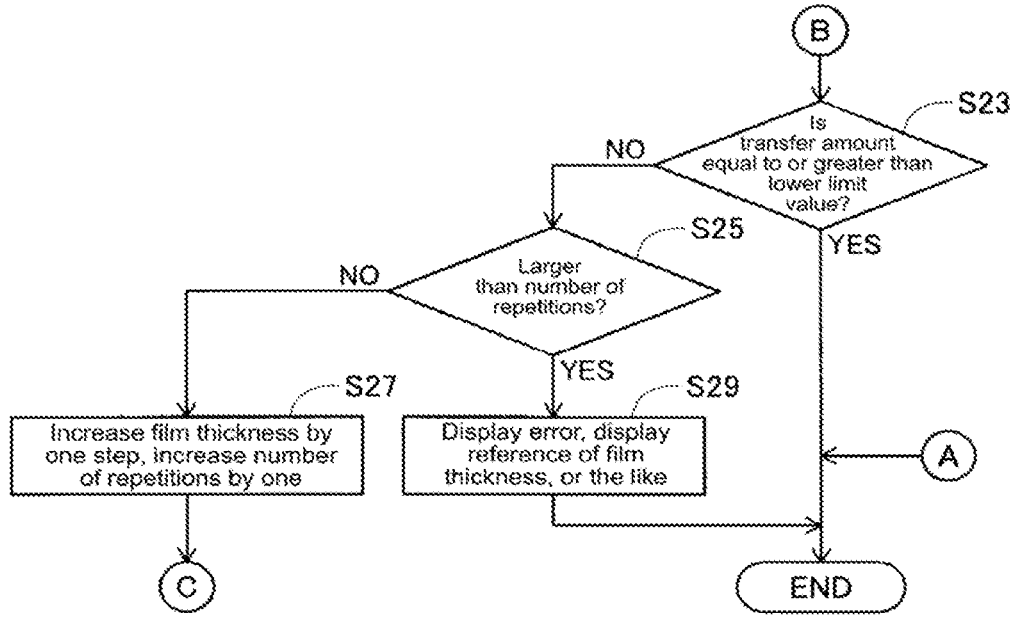
FIG. 6 is a flowchart of the film thickness adjusting work.

FIGS. 5 and 6 show flowcharts of the film thickness adjusting work. For example, when controller 93 receives an operation from the user on display device 99 (touch panel), controller 93 performs a work of transferring flux F to electronic component 110 on a test basis prior to the mounting work, and adjusts the film thickness according to the transfer status. First, in step (hereinafter, referred to as "S") S11 shown in FIG. 5, controller 93 captures an image of electronic component 110 by component camera 15 before transferring flux F. Controller 93 causes the supply device to supply electronic component 110 used for the mounting work, and causes mounting head 41 to pick up and hold electronic component 110. Controller 93 moves mounting head 41 to the upper side of component camera 15, and captures an image of electronic component 110 by component camera 15 from below (S11).

Next, controller 93 moves mounting head 41 to the upper side of flux unit 18. Controller 93 lowers suction nozzle 43 to immerse bump 112 of electronic component 110 in storage section 64, thereby transferring flux F to bump 112 (S13).

Next, controller 93 causes component camera 15 to capture an image of electronic component 110 to which flux F has been transferred (S15). Controller 93 moves mounting head 41 to the upper side of component camera 15, and an image of electronic component 110 having bump 112 to which flux F has been transferred is captured by component camera 15 from below.

Next, controller 93 detects the transfer amount of flux F transferred to bump 112 based on the image data captured by component camera 15 (S17: detection processing). For example, controller 93 detects the transfer amount based on the brightness of bump 112. Controller 93 detects the transfer amount by comparing the brightness of bump 112 before the transfer of flux F with the brightness of bump 112 after the transfer. The brightness of bump 112 decreases as the transfer amount of flux F increases. Therefore, controller 93 can detect the transfer amount based on the decrease in brightness before and after the transfer. For example, in memory 93A (see FIG. 4) of controller 93, threshold data D2 for determining whether the transfer amount is good or bad is stored. Threshold data D2 stores a table indicating the correspondence relationship between the amount of decrease in brightness of bump 112 and the amount of transfer. Thus, controller 93 can detect the transfer amount of flux F transferred to bump 112 by detecting the transfer amount corresponding to the detected decreased amount from the table. The method of detecting the transfer amount is not limited to the method based on the brightness, and for example, the image data may be processed to detect the edge of the transfer range of flux F and calculate the transfer amount from the area of the transfer range.

Figure 7:
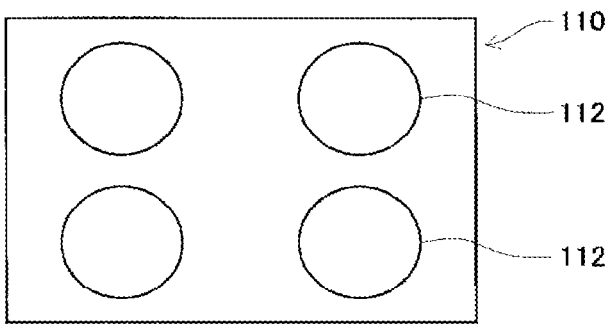
FIG. 7 is a schematic diagram showing a bump before transfer.
Figure 8:
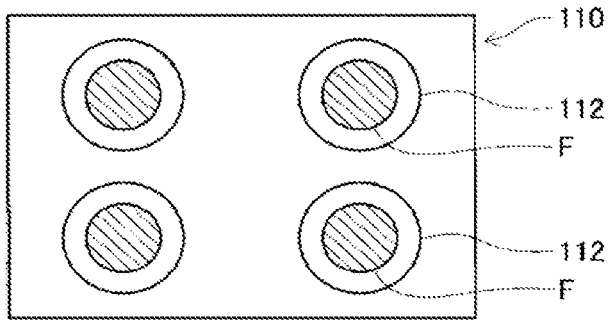
FIG. 8 is a schematic diagram showing a bump after transfer.
Figure 9:
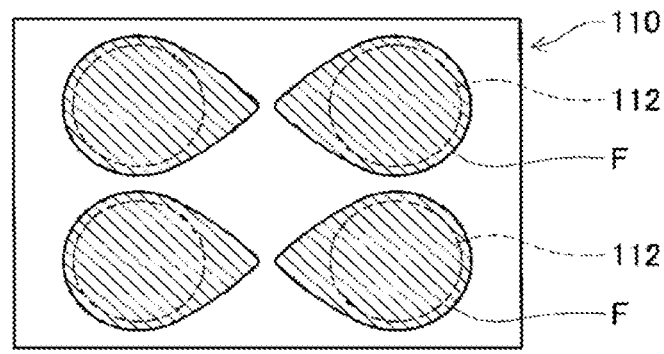
FIG. 9 is a schematic diagram showing the bump after transfer.
Figure 10:
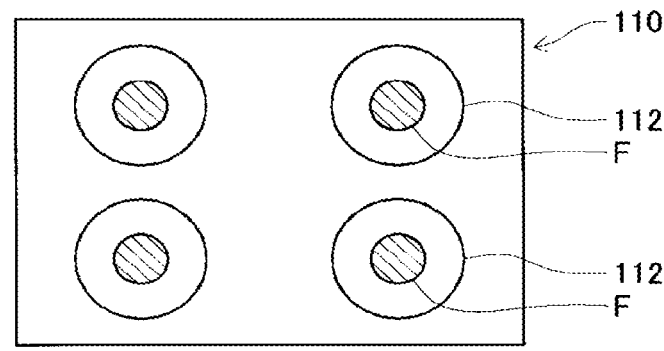
FIG. 10 is a schematic diagram showing the bump after transfer.

Next, controller 93 determines whether the transfer amount of flux F is excessive (S19: determination processing). FIGS. 7 to 10 are diagrams schematically showing the lower face of electronic component 110, and show the relationship between bump 112 and flux F. FIG. 7 shows the state of bump 112 before transfer. FIG. 8 shows a state of bump 112 to which flux F of an appropriate transfer amount has been transferred. FIG. 9 shows a state of bump 112 to which flux F is excessively transferred. FIG. 10 shows a state of bump 112 with a small transfer amount.

Figure 11:
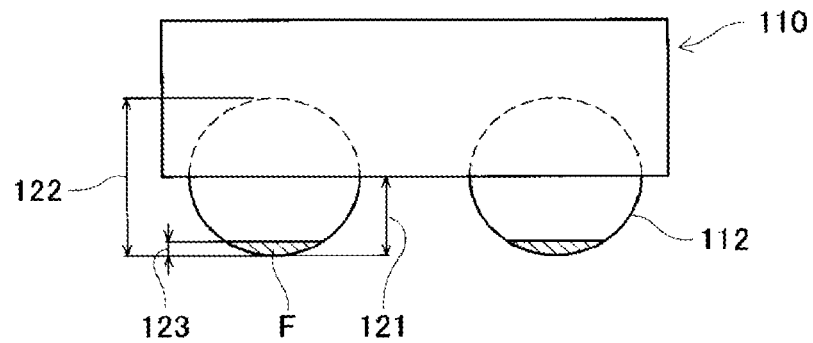
FIG. 11 is a schematic view of the electronic component as viewed from the side.

As shown in FIG. 7, flux F is not transferred to bump 112 before transfer, and bump 112 has, for example, a substantially constant brightness. As shown in FIG. 8, in bump 112 to which an appropriate transfer amount of flux F is transferred, for example, flux F is transferred around the center of the lower face. FIG. 11 schematically shows a state in which bump 112 to which flux F has been transferred is viewed from the side of electronic component 110. The appropriate transfer amount is, for example, a transfer amount recommended (allowed) by a component manufacturer or the like, and is a transfer amount that can sufficiently obtain wettability at the time of melting. An appropriate transfer amount is, for example, an amount obtained by transferring flux F to a height of 30% to 60% of bump height 121 of bump 112.

Assuming that the diameter of bump 112 is diameter 122, and that the portion of bump 112 protruding from the lower face of electronic component 110 (such as a mold) is half of the entire bump 112, bump height 121 is half of diameter 122. When diameter 122 is 150 µm (micrometers), bump height 121 is 75 µm.

Figure 12:
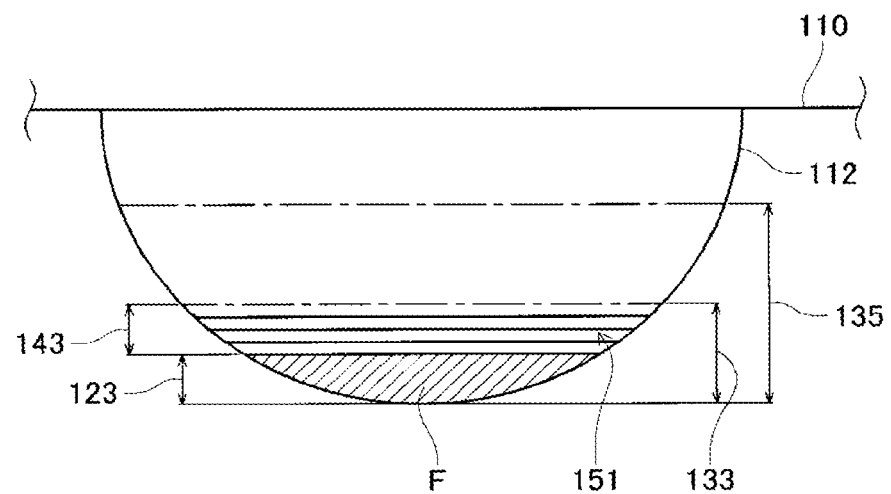
FIG. 12 is an enlarged view of the bump.

FIG. 12 schematically shows an enlarged view of bump 112. Distance 123 from the lower end of bump 112 to the upper end of flux F needs to be within a range from lower limit value 133 to upper limit value 135 shown in FIG. 12, for example, when flux F is transferred by an appropriate transfer amount. When the above-mentioned 30% to 60% is an appropriate transfer amount, lower limit value 133 is 22.5 µm (=75×0.3). Upper limit value 135 is 45 µm (=75×0.6). Controller 93 of the present embodiment adjusts the film thickness of flux F so that distance 123 falls within the range of lower limit value 133 and upper limit value 135.

Threshold data D2 of memory 93A stores the transfer amount when the transfer is performed up to each of upper limit value 135 and lower limit value 133. Controller 93 compares the transfer amount detected in S17 with the transfer amount corresponding to upper limit value 135 or the like to determine whether the transfer is good or bad. Controller 93 may determine the handled transfer amount without converting the brightness detected in S17 into the transfer amount based on the table of threshold data D2, while maintaining the brightness level. For example, the brightness level corresponding to upper limit value 135 and lower limit value 133 is stored in threshold data D2. Controller 93 may compare the brightness level of bump 112 with the brightness level of lower limit value 133 or the like to determine whether the transfer is defective (S19).

In S19, controller 93 determines whether the transfer amount of flux F is excessive, that is, whether the transfer amount is larger than the transfer amount corresponding to upper limit value 135. For example, in accordance with the transfer amount detected in S17 being larger than the transfer amount of upper limit value 135 (threshold data D2) (S19: YES), controller 93 determines that flux F is excessive. As shown in FIG. 9, for example, in bump 112 (electronic component 110) to which flux F is excessively transferred by more than upper limit value 135, flux F adheres to the entire surface of bump 112 and spreads to the lower face of electronic component 110. in accordance with determining that flux F has been transferred more than upper limit value 135 (S19: YES), controller 93 displays an error on display device 99 (S21).

Figure 13:
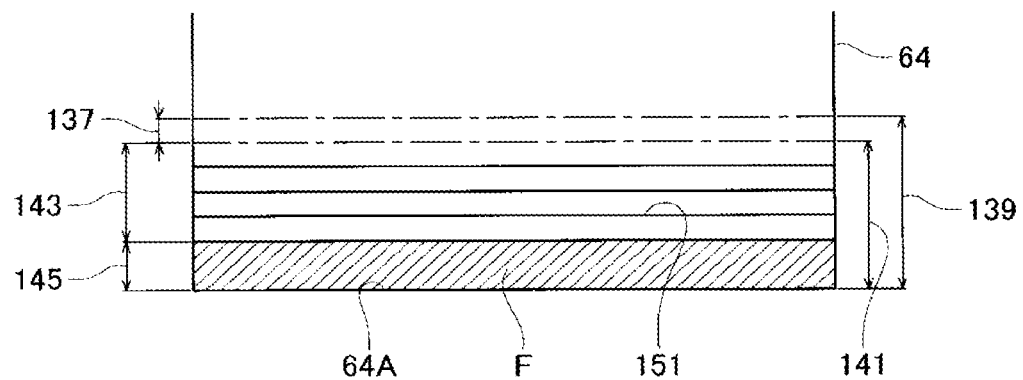
FIG. 13 is a schematic diagram showing the film thickness of a storage section.

Further, controller 93 can calculate a range of the allowable film thickness of flux F (hereinafter, sometimes referred to as an allowable film thickness range) based on the range of lower limit value 133 (22.5 µm) to upper limit value 135 (45 µm) described above. FIG. 13 schematically shows storage section 64. The range indicated by the one-dot chain line in FIG. 13 indicates allowable film thickness range 137. Upper limit value 139 of allowable film thickness range 137 corresponds to upper limit value 135 shown in FIG. 12. Lower limit value 141 of allowable film thickness range 137 corresponds to lower limit value 133 shown in FIG. 12.

For example, in a case where the lower end of bump 112 is immersed in contact with bottom face 64A of storage section 64, upper limit value 139 of allowable film thickness range 137 coincides with upper limit value 135. Lower limit value 141 coincides with lower limit value 133. However, in the actual adjusting work, errors occur due to the viscosity of flux F, the warpage of electronic component 110, and the like. Accordingly, controller 93 of the present embodiment sets, for example, increase amount 143 which is the actual amount of transfer shown in FIG. 12 from distance 123 to lower limit value 133 which is the threshold as the height from the surface of flux F of storage section 64 to lower limit value 141 (increase amount 143 shown in FIG. 13), and uses it as a reference of film thickness 145 of flux F of storage section 64.

In S21, controller 93 displays a value (for example, lower limit value 141 and upper limit value 139 in consideration of increase amount 143) serving as a reference as film thickness 145 of flux F on display device 99 based on increase amount 143 (reference notification processing). With this, for example, the user can manually adjust film thickness 145 of storage section 64 by using a micrometer or the like with reference to a value (such as lower limit value 141) which is a reference of the displayed (issued) film thickness 145, and can set appropriate film thickness 145. Alternatively, the user can set appropriate film thickness 145 for electronic component mounting machine 10 by operating display device 99 (touch panel). The method of issuing a notification of the reference value is not limited to display, and for example, the reference value may be transmitted as data to a management device or the like, or may be issued a notification to the user by sound.

In S21, controller 93 may automatically adjust film thickness 145 of flux F based on increase amount 143. For example, after discarding electronic component 110 to which flux F has been transferred in discard box 17, controller 93 executes the above-described processing in step S21, and ends the processing shown in FIGS. 5 and 6.

Further, in accordance with the determination in S19 that flux F is not excessively transferred (S19: NO), controller 93 determines whether the transfer amount is equal to or greater than lower limit value 133 shown in FIG. 12 (S23: determination processing). When the transfer amount is equal to or greater than lower limit value 133 (S23: YES), the transfer amount becomes equal to or greater than lower limit value 133 and equal to or less than upper limit value 135, which is an appropriate amount. in accordance with the transfer amount being equal to or greater than lower limit value 133 (S23: YES), for example, controller 93 discards electronic component 110 to which flux F has been transferred to discard box 17, and then ends the processing shown in FIGS. 5 and 6. As a result, film thickness 145 of flux F becomes an appropriate thickness. In the mounting work after the adjustment, an appropriate amount of flux F can be transferred to bump 112 of electronic component 110. When the film thickness adjusting work shown in FIGS. 5 and 6 is performed during the mounting work, controller 93 mounts electronic component 110 to which flux F has been transferred on boards B1 and B2 in accordance with the transfer amount being equal to or greater than lower limit value 133 (S23: YES).

in accordance with the transfer amount being less than lower limit value 133 (S23: NO), controller 93 determines the number of repetitions (S25). Controller 93 executes the adjustment processing (S27) of film thickness 145, which will be described later, for a number of times of repetition set in advance. The number of repetitions is set in advance by the user with respect to electronic component mounting machine 10, for example.

In S25, when the number of repetitions is equal to or less than the number of times set in advance (S25: NO), controller 93 increases film thickness 145 by one stage (S27). When it is determined that the transfer amount is less than lower limit value 133 (S23: NO), as shown in FIGS. 10 and 12, for example, flux F is transferred only to the tip end side of lower limit value 133 of bump 112, so that the transfer amount is small. Therefore, in S27, controller 93 of the present embodiment divides increase amount 143 from the actual transfer amount (distance 123) to lower limit value 133 (threshold) into multiple stage values 151 (for example, four stages in the shown example). Controller 93 increases film thickness 145 of flux F stored in storage section 64 by divided increase amount 143, that is, by one stage value 151. Controller 93 causes flux unit 18 to increase film thickness 145 by one stage (stage value 151) (S27). Controller 93 increases the number of repetitions by one (S27).

After increasing film thickness 145 by stage value 151 (one stage) (S27), controller 93 executes the processing from S13 shown in FIG. 5 again (repetitive processing). With this, when the transfer amount of flux F is small, film thickness 145 of flux F in storage section 64 is gradually increased so that the transfer amount approaches lower limit value 133 (threshold). In addition, controller 93 performs transfer to bump 112 while gradually increasing film thickness 145. By gradually increasing the amount of transfer of flux F to the bump, it is possible to suppress the occurrence of a situation in which the amount of transfer exceeds the allowable range in a single adjustment, and to more reliably bring film thickness 145 closer to the optimum value.

In addition, controller 93 of the present embodiment executes processing (transfer processing) of transferring flux F to bump 112 by a number of times of repetition set in advance while increasing film thickness 145 by stage value 151 (one stage). With this, controller 93 (control device) repeats the transfer (S13), the determination (S19, S23), and the adjustment (S27) after the film thickness adjustment while gradually increasing film thickness 145, whereby it becomes possible to automatically detect and set appropriate film thickness 145. Film thickness 145 of controller 93 may not be gradually increased, but may be increased to lower limit value 133 at once.

In S25, in accordance with the number of repetitions becoming larger than the number of times set in advance (S25: YES), controller 93 executes error display, display of film thickness 145 (upper limit value 139 or lower limit value 141) serving as a reference, and the like, similarly to S21, and ends the processing shown in FIGS. 5 and 6. According to this processing, controller 93 can perform an appropriate response, such as an error notification, in case of the desired transfer amount being not achieved although adjustment has been made for the repetition number of times set in advance.

Flux F is an example of viscous fluid. Mounting head 41 is an example of a head section. Light section 15A is an example of an irradiation section. Component camera 15 is an example of an imaging section.

With the first embodiment described above in detail, the following effects are obtained. In accordance with the transfer amount being smaller than the predetermined threshold (S23: NO), controller 93 transfers flux F to bump 112 and the like. With this, bump 112 of electronic component 110 can be immersed in flux F again or film thickness 145 of flux F of storage section 64 can be thickened and then immersed in accordance with the transfer amount of flux F being smaller than the predetermined threshold. Thus, by increasing the transfer amount of flux F transferred to bump 112, an appropriate amount of the viscous fluid can be transferred to bump 112.

Second Embodiment

Figures 14, 15:
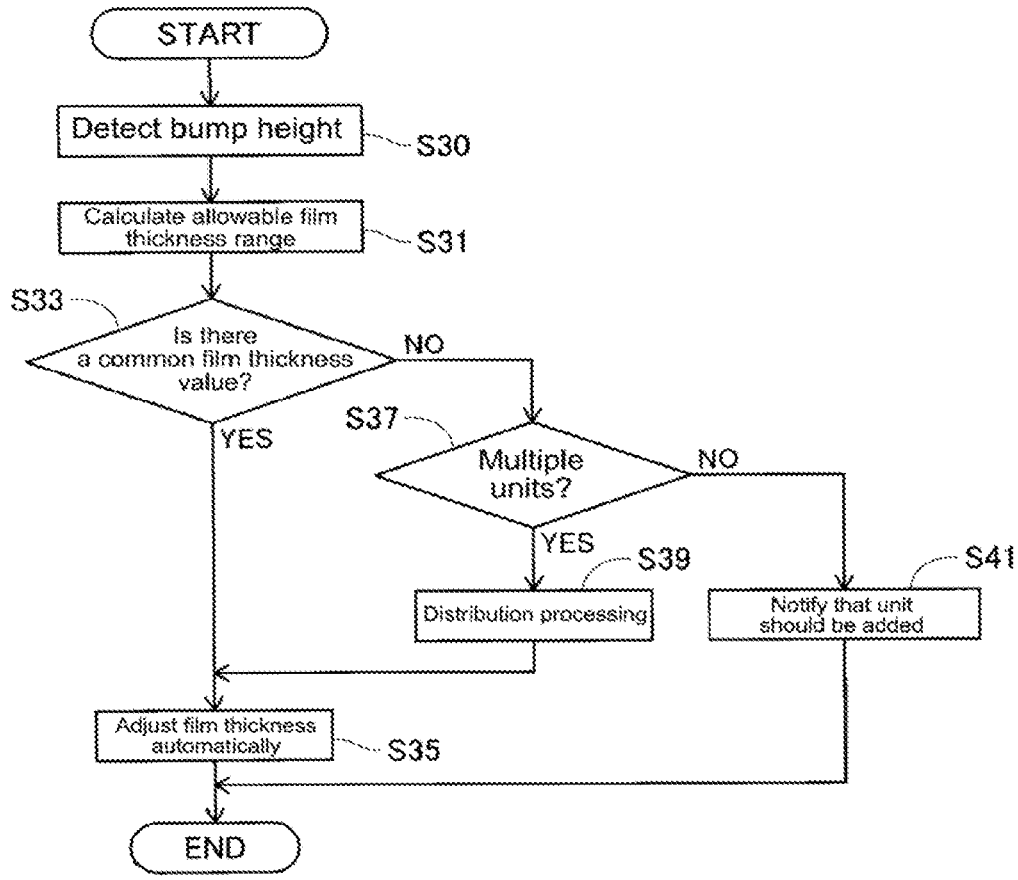
FIG. 14 is a flowchart of a film thickness adjusting work according to a second embodiment.
FIG. 15 is a table showing the allocation of a flux unit of the second embodiment.

Hereinafter, a second embodiment of the present application will be described with reference to the drawings. Prior to the mounting work, controller 93 of the second embodiment detects commonly usable film thickness 145 of multiple electronic components 110 used in the mounting work, and sets the film thickness as the film thickness of flux F. FIG. 14 shows a flowchart of the film thickness adjusting work of the second embodiment. Controller 93, for example, starts the film thickness adjusting work when the operation from the user is received by display device 99 (touch panel).

First, controller 93 detects bump height 121 (FIG. 11), which is the height of bump 112, for each of multiple electronic components 110 to be mounted (used) to board B1 and B2 in the mounting work (S30). In control data D1 (see FIG. 4) for performing the mounting work of the present embodiment, bump height 121 is set as information on electronic component 110 used in the mounting work. Controller 93 detects bump height 121 for each of multiple electronic components 110 based on control data D1. Controller 93 may detect bump height 121 by another method. For example, controller 93 may capture an image of bump 112 picked up and held by suction nozzle 43 from the side by a camera provided in mounting head 41, process the captured image data, and detect bump height 121.

Next, controller 93 calculates an allowable film thickness range allowed as film thickness 145 of flux F based on detected bump height 121 and a threshold (for example, threshold data D2) set in advance as the amount of flux F to be transferred to bump height 121. FIG. 15 shows an example of the allowable film thickness range. For example, in the same manner as in the above embodiment, the transfer amount of 60% to 30% of bump height 121 is set in threshold data D2 as the transfer amount that can sufficiently obtain (allow) the wettability at the time of melting. As shown in FIG. 15, when bump height 121 is 300 μm, upper limit value 135 (see FIG. 12) to which bump 112 is transferred is 180 μm (=300×0.6). Lower limit value 133 (see FIG. 12) is 90 μm (=300.3). Controller 93 calculates upper limit value 135 and lower limit value 133 based on bump height 121 (control data D1) and threshold information (threshold data D2).

Unlike the first embodiment described above, controller 93 of the second embodiment does not actually perform transfer to adjust film thickness 145, but calculates and sets allowable film thickness range 137 (see FIG. 13) based on the setting data (control data D1 and threshold data D2). Therefore, controller 93 sets calculated upper limit value 135 as upper limit value 139 (see FIG. 13) of allowable film thickness range 137, and sets calculated lower limit value 133 as lower limit value 141 (see FIG. 13) of allowable film thickness range 137. As shown in FIG. 15, allowable film thickness range 137 is, for example, in the range of 90 μm to 180 μm. That is, by setting film thickness 145 in the range of 90 μm to 180 μm from bottom face 64A of storage section 64, flux F can be favorably transferred to electronic component 110 in which bump height 121 is 300 μm in setting.

In step S31, controller 93 calculates allowable film thickness range 137 for each of multiple electronic components 110 to be mounted on boards B1 and B2 (detection processing). Next, controller 93 determines whether there is common film thickness value CT that satisfies allowable film thickness range 137 of all mounted electronic components 110 (S33: determination processing). For example, as shown in FIG. 15, in electronic component 110 having bump height 121 of 300 μm and 250 μm, allowable film thickness range 137 overlaps in the range of 90 μm to 150 μm. Therefore, for example, 100 μm can be set as common film thickness value CT that satisfies each allowable film thickness range 137.

If only two types of electronic components 110 having bump heights 121 of 300 μm and 250 μm are mounted, common film thickness value CT of 100 μm is film thickness 145 that can be commonly used for all electronic components 110 to be mounted. In this case, since common film thickness value CT exists for the two types of electronic components 110 (S33: YES), controller 93 causes flux unit 18 so that film thickness 145 becomes 100 μm (S35). With this, since controller 93 automatically adjusts film thickness 145 usable for multiple electronic components 110, the adjustment of film thickness 145 by the user becomes unnecessary.

Then, controller 93 ends the processing shown in FIG. 14. In the mounting work after the film thickness adjustment operation, an appropriate amount of flux F can be transferred to bump 112. Controller 93 may issue a notification to the user of common film thickness value CT by displaying common film thickness value CT on display device 99 without automatically adjusting common film thickness value CT.

On the other hand, when there is no common film thickness value CT that satisfies allowable film thickness range 137 of all electronic components 110 to be mounted (S33: NO), controller 93 determines whether multiple flux units 18 are mounted (S37: mounting determination processing). in accordance with the mounting of multiple flux units 18 (S37: YES), controller 93 causes film thickness 145 of each of multiple flux units 18 to have different common film thickness value CT. Based on common film thickness value CT and allowable film thickness range 137, controller 93 distributes the immersion destination of each of multiple electronic components 110 to any one of multiple flux units 18 (S39: distribution processing).

As shown in FIG. 15, in electronic component 110 having bump height 121 of 100 μm and 80 μm, allowable film thickness range 137 overlaps in the range of 30 μm to 48 μm. Allowable film thickness range 137 does not overlap with allowable film thickness range 137 (90 μm to 150 μm) of electronic component 110 in which bump height 121 is 300 μm and 250 μm, respectively. Therefore, for example, when two flux units 18 are mounted on electronic component mounting machine 10, controller 93 sets film thickness 145 of one flux unit 18 to 100 μm (common film thickness value CT). Flux unit 18 is set as a place in which each of electronic components 110 having bump height 121 of 300 μm and 250 μm is immersed (first flux unit in FIG. 15).

Film thickness 145 of the other flux unit 18 is set to 40 μm (common film thickness value CT). Flux unit 18 is set as a place in which each of electronic components 110 having a bump height 121 of 100 μm and 80 μm is immersed (second flux unit in FIG. 15). Controller 93 controls flux units 18 so that film thickness 145 is equal to the value described above (S35). With this, controller 93 sets film thickness 145 of multiple flux units 18 to different common film thickness values CT, and automatically distributes flux units 18 that can be transferred well as electronic components 110 to be immersed therein. This eliminates the need for the user to determine in which multiple flux units 18 electronic component 110 should be immersed. When the number of flux units 18 is insufficient for the number of common film thickness values CT set in multiple electronic components 110, that is, when the number of flux units 18 is insufficient as the distribution destination, controller 93 may issue a notification of an error. In addition to the notification of the error, for example, a notification to prompt the addition of flux unit 18, more specifically, the number of units to be added, the type of units, and the like may be issued. At this time, the value of film thickness 145 to be set to flux unit 18 to be added may be issued in accordance with the notification of the addition. Thus, the user can manually set film thickness 145 in addition to preparing flux unit 18.

Further, if electronic component mounting machine 10 is configured to be capable of automatically increasing the number of flux units 18, the number of flux units 18 may be increased automatically. For example, a unit moving device for automatically conveying flux unit 18 or connecting flux unit 18 to electronic component mounting machine 10 may be disposed on a production line in which electronic component mounting machine 10 is installed, and flux unit 18 may be automatically added. For example, electronic component mounting machine 10 may request the management device of the production line to add flux unit 18, the management device may receive a request from electronic component mounting machine 10, move the unit moving device, and the like, and add flux unit 18 to necessary electronic component mounting machine 10. Further, in S37, in accordance with the fact that multiple flux units 18 are not mounted (S37: NO), controller 93 issues a notification that flux units 18 should be added (S41). With this, the user can appropriately obtain the timing at which flux unit 18 should be added by checking the notification from controller 93. Then, controller 93 ends the processing shown in FIG. 14.

Board conveyance device 20 is an example of a conveyance section.

With the second embodiment described above in detail, the following effects are obtained. Controller 93 automatically determines common film thickness value CT that can be commonly used for multiple electronic components 110 to be mounted. When controller 93 determines that common film thickness value CT exists (S33: YES), controller 93 can issue a notification to the user of common film thickness value CT or can automatically set common film thickness value CT. As a result, the user does not have to decide a film thickness value that can be commonly used for multiple electronic components 110. Further, there is no possibility that an erroneous film thickness value is determined by the user, and an appropriate amount of flux F can be transferred to bump 112.

It should be noted that the present application is not limited to the above-mentioned embodiments, and various modifications and changes can be made within a range not departing from the spirit of the present application. For example, the configuration of flux unit 18 of each of the above embodiments is an example, and can be appropriately changed. For example, flux unit 18 may be configured to fix squeegee 77, move storage section 64, and adjust film thickness 145 of flux F. The viscous fluid in the present application is not limited to flux, and may be other viscous fluid (such as cream solder). Further, in the above embodiment, mounting head 41 is provided with suction nozzle 43 which picks up and holds electronic component 110 by a change in atmospheric pressure as the mounting nozzle which holds the electronic component, but may be provided with the mounting nozzle which is configured to hold electronic component 110 by another method such as sandwiching by a chuck.

REFERENCE SIGNS LIST 10 electronic component mounting machine; 15 component camera (imaging section); 15A light section (irradiation section); 20 board conveyance device (conveyance section); 41 mounting head (head section); 64 storage section; 91 control device; 110 electronic component; 112 bump; 137 allowable film thickness range; CT common film thickness value; F flux (viscous fluid).

The invention claimed is:

1. An electronic component mounting machine comprising:
   a conveyance section configured to convey a board;
   a storage section configured to store viscous fluid;
   a head section configured to hold an electronic component having a bump; and
   a control device configured to control the head section, to immerse the bump of the electronic component in the viscous fluid, and to mount the electronic component having the bump to which the viscous fluid has been transferred on the board,
   wherein the control device performs detection processing for detecting an allowable film thickness range allowed as a film thickness of a fluid film formed by the viscous fluid stored in the storage section for each of the multiple electronic components mounted on the board, and determination processing for determining whether a common film thickness value satisfying the allowable film thickness range of at least two electronic components among the multiple electronic components mounted on the board exists, and
   wherein the control device performs mounting determination processing for determining whether the multiple storage sections are mounted in accordance with the absence of the common film thickness value satisfying the allowable film thickness range for all the multiple electronic components mounted on the board, and distribution processing for setting the film thickness of the fluid film in each of the multiple storage sections to a different common film thickness value in accordance with the mounting of the multiple storage sections and distributing a destination in which each of the multiple electronic components is immersed to any of the multiple storage sections based on the allowable film thickness range.

2. The electronic component mounting machine according to claim 1,
   wherein the control device adjusts a film thickness of a fluid film formed by the viscous fluid based on the common film thickness value in accordance with determining that the common film thickness value exists.

3. The electronic component mounting machine according to claim 1,
   wherein the control device issues a notification that the storage section needs to be added when the multiple storage sections are not mounted in the mounting determination processing.

4. A mounting method executed in an electronic component mounting machine including a conveyance section configured to convey a board, a storage section configured to store viscous fluid, a head section configured to hold an electronic component having a bump, and a control device configured to control the head section, to immerse the bump of the electronic component in the viscous fluid, and to mount the electronic component having the bump to which the viscous fluid has been transferred on the board, the method comprising:

detecting an allowable film thickness range allowed as a film thickness of a fluid film formed by the viscous fluid stored in the storage section for each of the multiple electronic components mounted on the board;

determining whether a common film thickness value satisfying the allowable film thickness range of at least two electronic components among the multiple electronic components mounted on the board exists;

determining whether the multiple storage sections are mounted in accordance with the absence of the common film thickness value satisfying the allowable film thickness range for all the multiple electronic components mounted on the board; and setting the film thickness of the fluid film in each of the multiple storage sections to a different common film thickness value in accordance with the mounting of the multiple storage sections and distributing a destination in which each of the multiple electronic components is immersed to any of the multiple storage sections based on the allowable film thickness range.

* * * * *